(12) United States Patent
Chen

(10) Patent No.: US 7,410,597 B2
(45) Date of Patent: Aug. 12, 2008

(54) THERMALLY CONDUCTIVE MATERIAL

(75) Inventor: Ga-Lane Chen, Fremont, CA (US)

(73) Assignee: Hon Hai Precsision Industry Co., Ltd., Tu-Cheng, Taipei Hsien (TW)

( * ) Notice: Subject to any disclaimer, the term of this patent is extended or adjusted under 35 U.S.C. 154(b) by 341 days.

(21) Appl. No.: 11/212,337

(22) Filed: Aug. 26, 2005

(65) Prior Publication Data

US 2007/0235682 A1    Oct. 11, 2007

(30) Foreign Application Priority Data

Aug. 27, 2004    (TW) ............... 93125723 A

(51) Int. Cl.
  *C09K 5/00* (2006.01)
  *C09K 5/08* (2006.01)
  *C09K 5/10* (2006.01)

(52) U.S. Cl. ............... 252/71; 62/114; 62/119; 165/104.11; 165/104.19; 252/70

(58) Field of Classification Search ............ 165/104.19, 165/104.11; 252/70, 71; 62/114, 119
See application file for complete search history.

(56) References Cited

U.S. PATENT DOCUMENTS

| 4,713,942 | A * | 12/1987 | Hofmann ............... 62/62 |
| 5,698,140 | A * | 12/1997 | Lamb et al. ............ 252/502 |
| 6,530,420 | B1 | 3/2003 | Takada et al. |
| 2004/0232389 | A1 * | 11/2004 | Elkovitch ............ 252/500 |
| 2005/0002851 | A1 * | 1/2005 | McElrath et al. ......... 423/447.3 |
| 2005/0070658 | A1 * | 3/2005 | Ghosh et al. ............ 524/495 |
| 2006/0032243 | A1 * | 2/2006 | Chen ............... 62/114 |
| 2006/0046947 | A1 * | 3/2006 | Chen ............... 510/407 |
| 2006/0231399 | A1 * | 10/2006 | Smalley et al. ........... 204/450 |
| 2006/0251568 | A1 * | 11/2006 | Fahlman ............ 423/447.3 |
| 2006/0293434 | A1 * | 12/2006 | Yodh et al. ............ 524/495 |

FOREIGN PATENT DOCUMENTS

| TW | 593954 | 6/2004 |
| WO | WO 2004/027336 A1 | 4/2004 |

OTHER PUBLICATIONS

Derwent-Acc-No. 2006-727748, abstract of China Patent Specification No. CN 1740264A (Mar. 2006).*
Derwent-Acc-No. 2007-156607, abstract of Taiwan Patent Specification No. TW 250050 B1 (Mar. 2006).*

* cited by examiner

*Primary Examiner*—Anthony J Green
(74) *Attorney, Agent, or Firm*—Morris Manning Martin LLP; Tim Tingkang Xia, Esq.

(57) ABSTRACT

A thermally conductive material includes a supercritical fluid and a number of carbon nanotubes incorporated in the supercritical fluid. The supercritical fluid may be selected from a group consisting of carbon dioxide, water, ammonia, ethane, ethane, nitrous oxide, propane, butane, pentane, and so on. The carbon nanotubes may be selected from the group consisting of single-wall carbon nanotubes, double-wall carbon nanotubes, mult-wall carbon nanotubes, or other kinds of carbon nanotubes. The carbon nanotubes have an average length of less than 1 micron and an average diameter of less than 100 nanometers. The supercritical fluid has dual characteristices of a liquid and a gas, and the carbon nanotubes have excellent thermal conductivity. As a result, the thermally conductive material becomes a nano-super heat conductor with excellent thermal conductivity and high efficiency of thermal conductivity, and is suitable for heat dissipation of various heat sources.

14 Claims, 2 Drawing Sheets

THERMALLY CONDUCTIVE MATERIAL

TECHNICAL FIELD

The present invention relates to a thermally conductive material, and more particularly to a thermally conductive material with a fluid carrier.

BACKGROUND

Cooling is an important means for ensuring that a high-density integrated electronic device such as a CPU is kept within its operational temperature limit. Generally, the types of apparatuses for cooling is selected from extruded metal heat sinks, fans, water, air conditioning, heat pipes, etc. Compared to heat pipes, the other cooling units have certain inherent limitations such as large size, heavy weight, and low heat transferring efficiency. A typical heat pipe generally includes a wick structure attached an inside wall of a shell, and a working fluid received in the wick structure.

In the heat pipe, the working fluid is utilized as a heating medium to transfer heat by an evaporation-condensation cycle with the help of capillarity action. The types of working fluid generally are a main factor in determining the operation performance of the heat pipe. Nowadays, a variety of working fluid may be suitable used, depending on the particular application. The basic requirements for working fluids are as follows:

Compatibility with the wick and the wall of the shell materials;
Good thermal stability;
Wettability of the wick and the wall;
High latent heat;
High thermal conductivity;
Low liquid and vapor viscosities;
High surface tension.

The working fluids employed in the heat pipe typically include water, ammonia, methanol, acetone, heptane, etc. However, none of the working fluids is capable of satisfying all of the aforementioned requirements. This limits the heat-transferring efficiency of heat pipe. Consequently, some other techniques have been developed to overcome the limitation. For example, China Patent Application No. 02137681.6 discloses a nano-fluids having nanoparticles incorporated therein. The nano-fluid employs water or ammonia as the working fluid. Nanoparticles are dispersed in the working fluid. The nanoparticles are made of a material selected from the group consisting of silicon carbide, alumina, and magnesium oxide. A thermal conductivity of the overall working fluid may be increased to a certain extent due to the nanoparticles. However, the nanoparticles effectively make no contribution for improving the viscosity and diffusivity of the working fluid. In other words, the nanoparticles are incapable of improving the fluidity of the nano-fluids. In addition, the nanoparticles are unable to fully exhibit their excellent properties due to the limitation of the conventional working fluid.

In view of properties limitations of the conventional working fluid has led people to seek other suitable thermally conductive materials for use as working fluid in a heat pipe. For example, U.S. Pat. No. 6,530,420 issued on Mar. 11, 2003 discloses a heat carrier including a closed or looped heat pipe having a heat receiving section and a heat radiating section, and a heating medium received in the heat pipe. The heating medium becomes a low-viscous supercritical fluid when it is heated. The closed or looped heat pipe is entirely covered with a thermal insulation layer, except for the heat receiving section and the heat radiating section. Carbon dioxide is used as the heating medium received in the looped heat pipe. Carbon dioxide in the looped heat pipe becomes a very convective low viscous supercritical fluid under a pressure above 7.3 MPa and at a temperature of about 31° C. When a temperature gradient is created in the supercritical fluid in the looped heat pipe, it creates a density gradient. This causes the fluid to undergo natural convection without any external driving means, thereby transporting heat from the heat receiving section to the heat radiating section while circulating through the looped heat pipe. The supercritical fluid has a low viscosity, which is capable of enhancing the heat-transferring efficiency. However, the thermal conductivity of the supercritical fluid is relatively low. This limits the overall heat-transferring efficiency of the heat pipe.

What is needed, therefore, is a thermally conductive material which has both excellent thermal conductivity and fluidity.

SUMMARY

A thermally conductive material including a supercritical fluid and carbon nanotubes incorporated in the supercritical fluid. In a preferred embodiment, the supercritical fluid may be selected from the group consisting of carbon dioxide, water, ammonia, ethane, ethene, nitrous oxide, propane, butane, pentane, and so on. The supercritical fluid is in one of a supercritical state and a near critical state. The supercritical fluid has a viscosity lower than $10^{-4}$ Pa·sec. The carbon nanotubes may be selected from the group consisting of single-wall carbon nanotubes, double-wall carbon nanotubes, multi-wall carbon nanotubes, or other kinds of carbon nanotubes. The carbon nanotubes have an average length of less than 1 micron and an average diameter of less than 100 nanometers. A percentage by, of the carbon nanotubes relative to the thermally conductive material is in the range from 0.5 to 5 percent.

Compared with traditional working fluids, the supercritical fluid in a preferred embodiment of the invention has dual characteristics of a liquid and a gas; namely a liquid-like density, and at the same gas-like properties of diffusivity and viscosity. The supercritical fluid has an increased transfer rate. In addition, carbon nanotubes having superior thermal conductivity can enhance thermal conductivity of the supercritical fluid. As a result, the thermally conductive material of the preferred embodiment becomes a nano-super heat conductor having excellent thermal conductivity and high efficiency of heat transfer, so that heat generated from heat source can be swiftly dissipated outside.

Other advantages and novel features will be drawn from the following detailed description of preferred embodiments when taken in conjunction with the attached drawings, in which:

DETAILED DESCRIPTION OF THE EMBODIMENTS

Embodiments of the present invention will now be described in detail below and with reference to the drawings.

In accordance with a preferred embodiment of the present invention, a thermally conductive material includes a supercritical fluid and nanotubes of a particular element like carbon nanotubes uniformly dispersed in the supercritical fluid. The supercritical fluid may be selected from the group consisting of carbon dioxide, water, ammonia, ethane, ethene, nitrous oxide, propane, butane, and pentane. The following table 1 shows critical pressures, temperatures and critical densities of the above-mentioned materials under critical conditions. For example, carbon dioxide has a critical point at a pressure of about 7.29 MPa and a temperature of about 31.2° C., which critical point is denoted with the reference letter "C" in FIG. 1. In practice, achieving the critical conditions for carbon dioxide is easier than for the other supercritical fluids shown in table 1. Generally, carbon dioxide is chemically inert, and is thus safe to use. In addition, there are a variety of conventional well-established methods for generating carbon dioxide, which are known to those skilled in the art.

TABLE 1

| Material | Molecular Formula | Critical Pressure (MPa) | Critical Temperature (° C.) | Critical Density (g/cm$^3$) |
|---|---|---|---|---|
| Carbon Dioxide | $CO_2$ | 7.29 | 31.2 | 0.433 |
| Water | $H_2O$ | 21.76 | 374.2 | 0.332 |
| Ammonia | $NH_3$ | 11.25 | 132.4 | 0.235 |
| Ethane | $C_2H_6$ | 4.81 | 32.2 | 0.203 |
| Ethene | $C_2H_4$ | 4.97 | 9.2 | 0.218 |
| Nitrous Oxide | $N_2O$ | 7.17 | 36.5 | 0.450 |
| Propane | $C_3H_8$ | 4.19 | 96.6 | 0.217 |
| Butane | $C_4H_{10}$ | 3.75 | 135.0 | 0.228 |
| Pentane | $C_5H_{12}$ | 3.75 | 196.6 | 0.232 |

Figure 1:
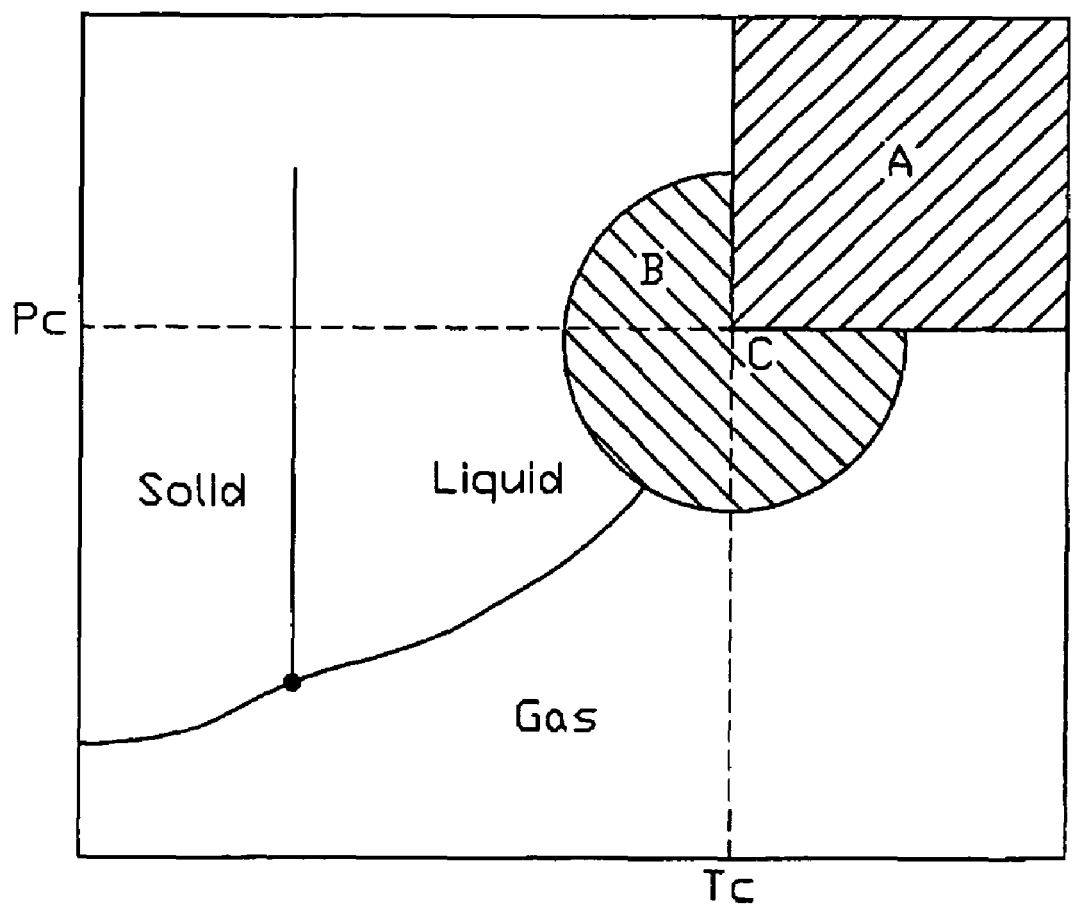
FIG. 1 is a phase diagram of carbon dioxide used as a thermally conductive materials according to a preferred embodiment of the present invention.

FIG. 1 shows a typical phase diagram of carbon dioxide with temperature as its horizontal coordinate and pressure as its vertical coordinate. The critical point of carbon dioxide locates at point "C" (Tc=31.2° C., Pc=7.29 MPa). A supercritical fluid of carbon dioxide is represented by a rectangle hatched region A. In the hatched region A, a temperature T of the carbon dioxide is higher than 31.2° C., and a pressure P of the carbon dioxide is higher than 7.29 Mpa. A pie-shaped hatched region B in FIG. 1 represents a near critical state of carbon dioxide. Carbon dioxide in the near critical state has similar properties with that in the supercritical state. The near critical state carbon dioxide can also used as a working fluid in exemplary embodiments of the present invention.

The carbon nanotubes may be single-wall carbon nanotubes (SWCNTs), multi-wall carbon nanotubes (MWCNTs) or double-wall carbon nanotubes (DWCNTs). The SWCNTs generally have smaller diameters, in the range of about 0.4 nm to about 2 nm. The MWCNTs generally have larger diameters, in the range of about 20 nm to about 100 nm. In the illustrated embodiment, the carbon nanotubes generally have an average diameter of less than about 100 nm and an average length of less than 1 μm. The lengths of carbon nanotubes are preferably within a nanoscale, so that the carbon nanotubes can be easily uniformly dispersed in the supercritical fluid. A percentage by mass of the carbon nanotubes of the thermally conductive material is preferably in the range from 0.5 percent and 5 percent, so as to avoid affecting the supercritical characteristics of the supercritical fluid. A thermal conductivity coefficient of the carbon nanotubes is generally over 6000 W/m·K. This figure is much higher than that of traditional thermal conductive materials such as copper (about 400 W/m·K) and aluminum (about 200 W/m·K).

The thermally conductive material may be employed as a working fluid for use in various types of heat exchangers or heat dissipation systems. A looped heat pipe is now taken as an example to illustrate an application of the thermally conductive material. The looped heat pipe comprises a condenser section and an evaporator section. The thermally conductive material received in the heat pipe, and runs circularly between the condenser section and the evaporator section. Heat is absorbed by the thermally conductive material at the heat evaporator section of the heat pipe, and is then transferred to the heat condenser section of the heat pipe. An amount of exchanged heat mainly depends on an enthalpy change of the supercritical fluid. The enthalpy change is little affected by the low content of the carbon nanotubes in supercritical fluid.

Figure 2:
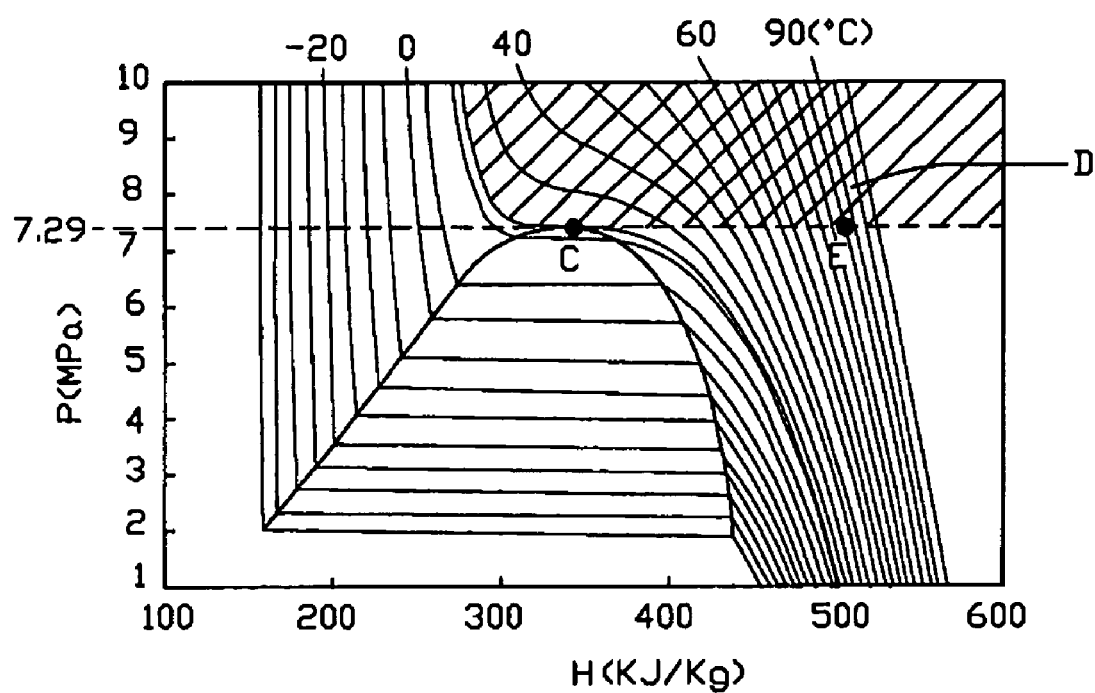
FIG. 2 is a Mollier diagram of carbon dioxide.

FIG. 2 shows a Mollier diagram of carbon dioxide. Carbon dioxide, in the supercritical state, is remarkably sensitive to temperature and pressure. A slight change of the temperature and/or pressure can cause a remarkable change of enthalpy. For example, an enthalpy change occurring between point "C" and point "E" is about 200KJ/Kg. Such an enthalpy change indicates that a huge amount of heat generated from heat sources has been effectively transferred to the thermally conductive material.

It will be understood that the particular aspects of the present invention are shown and described by way of illustration only, and not as limiting the invention. The principles and features of the present invention may be employed in various and numerous embodiments thereof without departing from the scope of the invention as claimed. The above-described embodiments illustrate the scope of the invention but do not restrict the scope of the invention.

We claim:

1. A thermally conductive material comprising:
   a supercritical fluid configured for an evaporation-condensation cycle; and
   a plurality of carbon nanotubes incorporated in the supercritical fluid, a percentage by mass of the carbon nanotubes relative to the thermally conductive material being in the range from 0.5% to 5%.

2. The thermally conductive material of claim 1, wherein the supercritical fluid is selected from a group consisting of carbon dioxide, water, ammonia, ethane, ethene, nitrous oxide, propane, butane, and pentane.

3. The thermally conductive material of claim 1, wherein the supercritical fluid is in one of a supercritical state and a near critical state.

4. The thermally conductive material of claim 3, wherein the supercritical fluid has a viscosity lower than 10$^{-4}$ Pa·sec.

5. The thermally conductive material of claim 1, wherein the carbon nanotubes are selected from the group consisting of single-wall carbon nanotubes, double-wall carbon nanotubes, and multi-wall carbon nanotubes.

6. The thermally conductive material of claim 5, wherein an average length of the carbon nanotubes is less than 1 μm.

7. The thermally conductive material of claim 6, wherein an average diameter of the carbon nanotubes is less than 100 nm.

8. A thermally conductive material comprising:
   a supercritical fluid configured for an evaporation-condensation cycle; and
   a plurality of thermally-conductive nanotubes dispersing within said supercritical fluid, a percentage by mass of said plurality of thermally-conductive nanotubes relative to the thermally conductive material being in a range from 0.5% to 5%.

9. The thermally conductive material of claim 8, wherein said plurality of thermally-conductive nanotubes has an average diameter less than 100 nm.

10. The thermally conductive material of claim 8, wherein said plurality of thermally-conductive nanotubes has an average length less than 1 μm.

11. The thermally conductive material of claim 8, wherein said supercritical fluid is selected from the group consisting of carbon dioxide, water, ammonia, ethane, ethene, nitrous oxide, propane, butane, and pentane.

12. The thermally conductive material of claim 8, wherein said supercritical fluid is in one of a supercritical state and a near critical state.

13. The thermally conductive material of claim 12, wherein said supercritical fluid has a viscosity lower than $10^{-4}$ Pa·sec.

14. The thermally conductive material of claim 8, wherein said plurality of thermally-conductive nanotubes are carbon nanotubes.

* * * * *